United States Patent
Schaffroth et al.

(10) Patent No.: US 6,675,322 B1
(45) Date of Patent: Jan. 6, 2004

(54) INTEGRATED CIRCUIT HAVING A SELF-TEST DEVICE

(75) Inventors: Thilo Schaffroth, Röhrmoos (DE); Florian Schamberger, Reichenhall (DE); Helmut Schneider, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/356,813

(22) Filed: Jul. 19, 1999

(30) Foreign Application Priority Data

Jul. 17, 1998 (DE) .......................... 198 32 307

(51) Int. Cl.⁷ .......................... G06F 11/00; G01R 31/28
(52) U.S. Cl. .......................... 714/25; 714/30; 714/742
(58) Field of Search .......................... 714/25, 27, 30, 714/32, 33, 39, 43, 48, 733, 734, 735, 742, 31

(56) References Cited

U.S. PATENT DOCUMENTS

| | | | |
|---|---|---|---|
| 4,503,537 A | * | 3/1985 | McAnney .................... 371/25 |
| 4,724,380 A | * | 2/1988 | Burrows et al. .......... 324/73 R |
| 4,764,926 A | * | 8/1988 | Knight et al. .................. 371/25 |
| 5,173,906 A | | 12/1992 | Dreibelbis et al. ......... 371/22.5 |
| 5,230,000 A | * | 7/1993 | Mozingo et al. ........... 371/22.4 |
| 5,260,946 A | * | 11/1993 | Nunally ..................... 371/22.1 |
| 5,659,312 A | * | 8/1997 | Sunter et al. ............... 341/120 |
| 5,706,296 A | | 1/1998 | Whetsel |
| 6,119,250 A | * | 9/2000 | Nishimura et al. ......... 714/718 |
| 6,313,656 B1 | * | 11/2001 | Schaffroth et al. .......... 324/763 |

FOREIGN PATENT DOCUMENTS

| EP | 0 330 841 A2 | 9/1989 |
|---|---|---|
| EP | 0 852 354 A1 | 7/1998 |

* cited by examiner

Primary Examiner—Nadeem Iqbal
(74) Attorney, Agent, or Firm—Laurence A. Green; Werner H. Stemer; Ralph E. Locher

(57) ABSTRACT

A self-test device serves for carrying out a self-test of an integrated circuit. An output of the self-test device is connected to a contact-making point of the circuit, which serves for external contact-making and which is connected to an input of a circuit unit of the integrated circuit to be tested. The self-test device feeds a test signal through the contact-making point to the circuit unit.

6 Claims, 1 Drawing Sheet

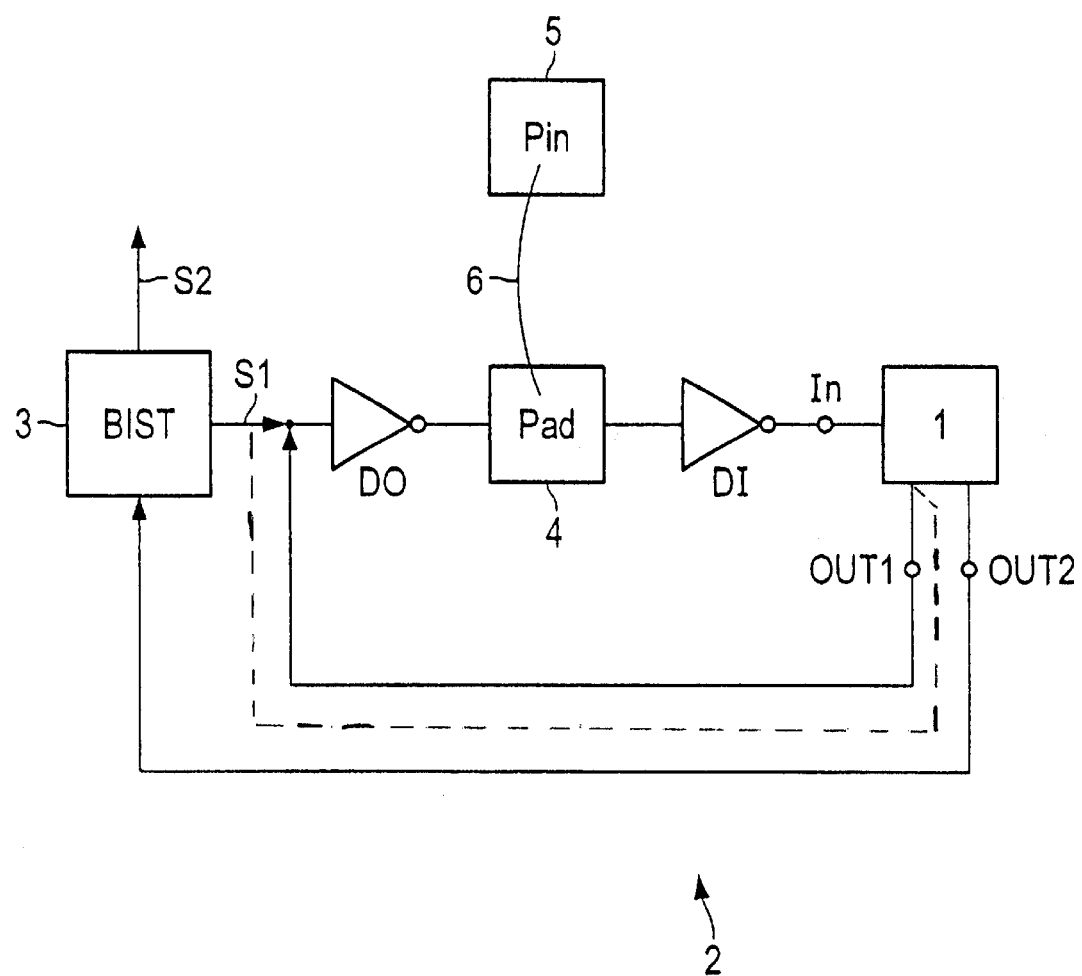

INTEGRATED CIRCUIT HAVING A SELF-TEST DEVICE

BACKGROUND OF THE INVENTION

Field of the Invention

The invention relates to an integrated circuit having a self-test device for carrying out a self-test of the integrated circuit.

An integrated circuit of that type is described in U.S. Pat. No. 5,173,906, for example. The self-test device, a so-called built-in self-test system, is an integral part of the integrated circuit. It contains a test pattern generator for generating test signals which are fed to circuit units of the integrated circuit that are to be tested. Result signals concerning the test that has been carried out are generated On-Chip and are read out to a point outside the chip after the test has been carried out. The test signals are transmitted from the self-test device to the circuit units to be tested through data lines situated on the chip.

SUMMARY OF THE INVENTION

It is accordingly an object of the invention to provide an integrated circuit having a self-test device, which overcomes the hereinafore-mentioned disadvantages of the heretofore-known devices of this general type and which affords improved testability through the use of its self-test device.

With the foregoing and other objects in view there is provided, in accordance with the invention, an integrated circuit, comprising a circuit unit to be tested, the circuit unit having an input; a contact-making point of the circuit for external contact-making, the contact-making point connected to the input of the circuit unit of the integrated circuit to be tested; and a self-test device for carrying out a self-test of the integrated circuit, the self-test device having an output connected to the contact-making point, and the self-test device feeding a test signal through the contact-making point to the circuit unit to be tested.

Therefore, in contrast to conventional circuits, the test signals are deliberately passed through the contact-making point which, by way of example, may serve for external contact-making through the use of test tips of a test unit or through the use of a bonding wire. The advantage which this procedure has over direct feeding of the test signal to the input of the circuit unit to be tested is that, in this way, the connection between the contact-making point and the input of the circuit unit to be tested is also tested. Consequently the test signal is fed to the circuit unit to be tested in a manner that is the same as the case when the test mode is not concerned, with signals fed in externally through the contact-making points. Therefore, in contrast to previous solutions, the invention makes it possible to test the connection between the contact-making point and the circuit unit to be tested without necessitating complicated changes to the integrated circuit or its self-test device. The output of the self-test device merely has to be connected to the contact-making point, instead of directly to the input of the circuit unit to be tested. In particular, the structure of the self-test device and the type of test patterns or test signals generated by that self-test device, as well as the way in which a result signal is generated for the test that has been performed and the outputting of the results to a point outside the integrated circuit, can be configured in exactly the same way as in conventional integrated circuits with self-test devices.

In accordance with another feature of the invention, the contact-making point is connected through an input driver to the input of the circuit unit to be tested, for feeding external signals to the circuit unit to be tested, in a normal operating mode of the integrated circuit; and the self-test device transmits the test signal to the contact-making point and from there through the input driver to the input of the circuit unit to be tested, in a test operating mode.

This has the advantage of resorting to components that are already required in the normal operating mode, namely the input driver data lines connected thereto, in order to feed the test signal to the circuit unit. Moreover, in this way this input driver is included in the testing by the self-test device.

In accordance with an additional or alternative feature of the invention, the output of the circuit unit is connected through an output driver to the contact-making point, for outputting signals of the circuit unit to a point outside the integrated circuit, in the normal operating mode; the output of the self-test device is connected through the output driver to the contact-making point; and the self-test device transmits the test signal through the output driver to the contact-making point, in the test operating mode.

This development affords the advantage of only requiring a single output driver in order to transmit the test signal from the self-test device to the contact-making point on one hand, in the test operating mode, and for outputting signals of the circuit unit through the contact-making point to a point outside the integrated circuit on the other hand, in the normal operating mode. Moreover, the output driver is included in the testing by the self-test device.

Both developments of the invention afford the advantage of permitting the test signal to be transmitted from the self-test device to the contact-making point, and from the contact-making point to the input of the circuit unit to be tested, through drivers that are already required in the normal operating mode and are therefore present in any case. As a result, no additional electrical connections and drivers need be provided. Furthermore, as a result of the test signal being fed through the two drivers, both the input driver of the circuit unit to be tested and its output driver are tested by the self-test device. Therefore, not only the circuit unit to be tested but also the drivers and the lines connected thereto are tested with little outlay.

In accordance with a concomitant feature of the invention, the output of the self-test device is connected to the output of the circuit unit in such a way that the self-test device transmits the test signal, in the test operating mode, first of all to the output of the circuit unit and from there through the output driver to the contact-making point.

This has the advantage of including the entire output data path of the circuit unit, from the output thereof as far as the contact-making point, in the testing by the self-test device.

Other features which are considered as characteristic for the invention are set forth in the appended claims.

Although the invention is illustrated and described herein as embodied in an integrated circuit having a self-test device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a block circuit diagram of an exemplary embodiment of an integrated circuit according to the invention.

DESCRIPTION OF THE PREFERRED EMBODIMENTS

Referring now in detail to the single FIGURE of the drawing, there is seen an integrated circuit or chip 2 which, by way of example, may be a logic circuit or a memory circuit. The integrated circuit 2 contains a circuit unit 1 to be tested, which, by way of example, may serve for executing logic functions. The circuit unit may also be a memory cell array of the integrated circuit. An external terminal 5 (Pin) of the integrated circuit or chip 2 is connected through a bonding wire 6 to a contact-making point 4 (Pad). The contact-making point 4 is in turn connected through an input driver DI to an input In of the circuit unit 1. A first output OUT1 of the circuit unit 1 is connected through an output driver DO to the contact-making point 4. In a normal operating mode of the integrated circuit 2, signals are fed from a point outside the integrated circuit, through the external terminal 5 and the input driver DI, to the circuit a unit 1, using the electrical connections just described. At other times, the circuit unit 1 outputs signals through the output driver DO and the external terminal 5 to a point outside the chip 2.

In order to carry out a self-test in a test operating mode of the chip 2, the latter additionally has a self-test device 3 (BIST=Built-In Self-Test). The self-test device 3 generates a test signal S1 and feeds it, in the test operating mode, through the output driver DO to the contact-making point 4 and from the latter through the input driver DI to the input of the circuit unit 1. A second output OUT2 of the circuit unit 1 is connected to an input of the self-test device 3. As a result, in the test operating mode, the self-test device 3 can ascertain which signals are generated by the circuit unit 1 due to the test signal S1 fed thereto. The self-test device 3 carries out a desired-actual comparison between the signals communicated by the circuit unit 1 and values stored in the self-test device 3, and communicates a corresponding result signal S2 to a point outside the integrated circuit.

In the normal operating mode, at any one time, only either the input driver DI is activated for the purpose of feeding external signals to the circuit unit 1, or the output driver DO is activated for the purpose of outputting signals generated by the circuit unit 1 at its first output OUT1 to a point outside the chip 2. However, in the test operating mode both drivers DO, DI are simultaneously active in order to transmit the test signal S1 from the self-test device 3 to the circuit unit 1.

The invention differs from known circuits in that the output of the self-test device 3 is not connected directly to the input of the circuit unit 1 but rather indirectly through the contact-making point 4. This affords the advantage of having the data path between the contact-making point 4 and the input IN of the circuit unit 1, which is utilized in the normal operating mode, also being additionally included in the testing by the self-test device 3. In the exemplary embodiment illustrated in the FIGURE, the test signal S1 is fed to the contact-making point 4 through the output driver DO that is utilized by the circuit unit 1 for the outputting of data in the normal operating mode. Therefore, the output driver is also included in the testing by the self-test device in the test operating mode.

In other exemplary embodiments of the invention, the output of the self-test device 3 may also be connected directly to the first output OUT1 of the circuit unit 1, as is indicated by a broken line, with the result that the test signal S1 traverses the entire output data path of the circuit unit from the first output OUT1 to the contact-making point. In this way, the entire output data path is included in the testing by the self-test device.

The self-test device may be realized as wired logic or it may contain a controller or processor which executes externally loadable test programs.

We claim:
1. An integrated circuit, comprising:
   a circuit unit to be tested, said circuit unit having an input;
   a contact-making point for external contact-making, said contact-making point connected to said input of said circuit unit to be tested;
   a self-test device for carrying out a self-test of the integrated circuit, said self-test device having an output connected to said contact-making point, and said self-test device feeding a test signal through said contact-making point to said circuit unit;
   an output driver connected between an output of said circuit unit and said contact-making point, for outputting signals of said circuit unit to a point outside the integrated circuit, in a normal operating mode of the integrated circuit;
   said output of said self-test device connected through said output driver to said contact-making point; and
   said self-test device transmitting the test signal through said output driver to said contact-making point, in a test operating mode of the integrated circuit.

2. The integrated circuit according to claim 1, wherein said output of said self-test device is connected to said output of said circuit unit, for transmitting the test signal from said self-test device to said output of said circuit unit and from said output of said circuit unit through said output driver to said contact-making point, in the test operating mode.

3. The integrated circuit according to claim 1, comprising:
   an input driver connected between said contact-making point and said input of said circuit unit for feeding in external signals in a normal operating mode of the integrated circuit;
   said self-test device transmitting the test signal to said contact-making point and from said contact-making point through said input driver to said circuit unit in the test operating mode.

4. The integrated circuit, comprising:
   a circuit unit to be tested, said circuit unit having an input;
   a contact-making point for external contact-making, said contact-making point connected to said input of said circuit unit to be tested;
   a self-test device for carrying out a self-test of the integrated circuit, said self-test device having an output connected to said contact-making point, and said self-test device feeding a test signal through said contact-making point to said circuit unit;
   an input driver connected between said contact-making point and said input of said circuit unit for feeding in external signals in a normal operating mode of the integrated circuit;
   an output driver connected between an output of said circuit unit and said contact-making point, for outputting signals of said circuit unit to a point outside the integrated circuit, in a normal operating mode of the integrated circuit;
   said output of said self-test device connected through said output driver to said contact-making point; and
   said self-test device transmitting the test signal through said output driver to said contact-making point, in a test operating mode of the integrated circuit.

5. The integrated circuit according to claim 4, wherein said self-test device transmits the test signal to said contact-making point and from said contact-making point through said input driver to said circuit unit in the test operating mode.

6. The integrated circuit according to claim 4, wherein said output of said self-test device is connected to said output of said circuit unit, for transmitting the test signal from said self-test device to said output of said circuit unit and from said output of said circuit unit through said output driver to said contact-making point in the test operating mode.

* * * * *